(12) United States Patent
Herner (10) Patent No.: US 7,501,331 B2
(45) Date of Patent: Mar. 10, 2009

(54) LOW-TEMPERATURE METAL-INDUCED CRYSTALLIZATION OF SILICON-GERMANIUM FILMS

(75) Inventor: S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 466 days.

(21) Appl. No.: 11/395,420

(22) Filed: Mar. 31, 2006

(65) Prior Publication Data

US 2007/0246764 A1   Oct. 25, 2007

(51) Int. Cl.
*H01L 21/20* (2006.01)

(52) U.S. Cl. ............ 438/486; 438/933; 438/FOR. 134; 438/FOR. 158; 438/FOR. 393; 257/E21.182; 257/E21.207; 257/E21.133; 257/E21.324; 257/19; 117/939; 148/DIG. 59; 430/57.5

(58) Field of Classification Search ................. 438/486, 438/933, FOR. 158, FOR. 393, FOR. 134; 257/19, E21.133, E21.324, E21.182, E21.207; 117/939; 430/57.5; 148/DIG. 59
See application file for complete search history.

(56) References Cited

U.S. PATENT DOCUMENTS

| | | | |
|---|---|---|---|
| 4,792,501 A * | 12/1988 | Allred et al. ................. 428/699 |
| 5,707,744 A * | 1/1998 | King et al. ................... 428/426 |
| 5,738,732 A * | 4/1998 | Nakamura et al. .......... 136/255 |
| 6,228,693 B1 * | 5/2001 | Maekawa et al. ........... 438/166 |
| 2005/0158950 A1 * | 7/2005 | Scheuerlein et al. ........ 438/257 |
| 2005/0221545 A1 * | 10/2005 | Kokubo et al. .............. 438/151 |

* cited by examiner

*Primary Examiner*—Thanh V Pham
(74) *Attorney, Agent, or Firm*—Eschweiler & Associates, LLC (57) ABSTRACT

The present invention provides for a low-temperature method to crystallize a silicon-germanium film. Metal-induced crystallization of a deposited silicon film can serve to reduce the temperature required to crystallize the film. Increasing germanium content in a silicon-germanium alloy further decreases crystallization temperature. By using metal-induced crystallization to crystallize a deposited silicon-germanium film, temperature can be reduced substantially. In preferred embodiments, for example in a monolithic three dimensional array of stacked memory levels, reduced temperature allows the use of aluminum metallization. In some embodiments, use of metal-induced crystallization in a vertically oriented silicon-germanium diode having conductive contacts at the top and bottom end is be particularly advantageous, as increased solubility of the metal catalyst in the contact material will reduce the risk of metal contamination of the diode.

38 Claims, 5 Drawing Sheets

LOW-TEMPERATURE METAL-INDUCED CRYSTALLIZATION OF SILICON-GERMANIUM FILMS

BACKGROUND OF THE INVENTION

The invention relates to a low-temperature method to crystallize a silicon-germanium film.

The relatively high temperature required to crystallize deposited semiconductor materials such as silicon and silicon-germanium alloys can have adverse effects on semiconductor devices. High temperatures can lead to unwanted diffusion of dopants, can cause peeling due to differential expansion and contraction of unlike materials during thermal cycles, and can prohibit the use of desirable conductive materials like aluminum which have low thermal tolerance. These disadvantages are particularly acute in monolithic three dimensional memory arrays, in which a memory level formed above a substrate will be exposed to the temperatures required to form additional memory levels stacked above it.

There is advantage, therefore, in lowering the temperature required to crystallize deposited semiconductor material.

SUMMARY OF THE PREFERRED EMBODIMENTS

The present invention is defined by the following claims, and nothing in this section should be taken as a limitation on those claims. In general, the invention is directed to crystallization of a deposited silicon-germanium alloy film.

A first aspect of the invention provides for a method for crystallizing a semiconductor film, the method comprising: depositing a film of a silicon-germanium alloy at a temperature below about 490 degrees C.; depositing a layer of a metal catalyst selected from the group consisting of nickel, cobalt, ruthenium, and aluminum, the metal catalyst in contact with the silicon-germanium film; and crystallizing the silicon-germanium alloy film at a temperature below about 490 degrees C.

A preferred embodiment of the present invention provides for a method for forming a first memory level comprising a plurality of first memory cells, the method comprising: depositing a film of a silicon-germanium alloy at a temperature below about 490 degrees C.; depositing a layer of a metal catalyst selected from the group consisting of nickel and aluminum, the metal catalyst in contact with the silicon-germanium film; crystallizing the silicon-germanium alloy film at a temperature not exceeding about 490 degrees C.; and forming the first memory cells, wherein each memory cell comprises a portion of the silicon-germanium alloy film.

Another preferred embodiment of the invention provides for a method for forming a monolithic three dimensional memory array, the method comprising: a) monolithically forming a first memory level above a substrate by a method comprising: i) depositing an amorphous film of a silicon-germanium alloy; ii) depositing a metal catalyst in contact with the silicon-germanium alloy film, the metal catalyst selected from the group consisting of nickel and aluminum; iii) annealing to crystallize the silicon-germanium alloy film, wherein during the steps of depositing and annealing the silicon-germanium alloy film, the temperature does not exceed about 490 degrees C.; iv) forming a first plurality of memory cells, each memory cell comprising a portion of the silicon-germanium alloy film, the first memory level comprising the first plurality of memory cells; and b) monolithically forming a second memory level above the first memory level.

Still another embodiment provides for a nonvolatile memory cell comprising: a portion of a bottom rail-shaped conductor, the bottom conductor comprising aluminum; a portion of a top rail-shaped conductor, the top conductor above the bottom conductor; and a vertically oriented semiconductor junction diode, the diode comprising a polycrystalline silicon-germanium alloy, the diode vertically disposed between the top conductor and the bottom conductor and electrically in series with them, wherein a film of a metal silicide-germanide is formed at the bottom or top of the diode.

Yet another embodiment provides for a monolithic three dimensional memory array comprising: a) a first memory level monolithically formed above a semiconductor substrate, the first memory level comprising: i) a first plurality of substantially parallel, substantially coplanar conductors extending in a first direction, the first conductors comprising aluminum; ii) a second plurality of substantially parallel, substantially coplanar conductors, the second conductors above the first conductors extending in a second direction, the second direction different from the first direction; iii) a first plurality of vertically oriented silicon-germanium junction diodes, each first diode vertically disposed between one of the first conductors and one of the second conductors and arranged electrically in series between them, wherein there is a layer of NiSiGe at the top or the bottom of the diode; and b) a second memory level monolithically formed above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Conventional semiconductor devices are formed in a monocrystalline semiconductor substrate, typically a silicon wafer. Such a substrate is a single crystal of semiconductor material, with no grain boundaries. Grain boundaries impede flow of charge carriers, making devices slower and causing the behavior across an array of devices to be less uniform.

When semiconductor material is deposited, it is generally amorphous or polycrystalline. It is known to deposit regions of certain metals, such as nickel, cobalt, ruthenium, and aluminum, on a film of amorphous silicon. The metal catalyzes crystallization: During a subsequent anneal, a metal catalyst such as nickel migrates through the silicon, leaving high-quality crystalline silicon behind it. To minimize nickel contamination of the silicon, it has been usual to crystallize outward from a very small region of nickel; e.g. either laterally from a narrow line or radially outward from an isolated spot.

Generally metal-induced crystallization of silicon is used with the aim of maximizing grain size and quality in a deposited silicon film. Metal-induced crystallization affords an additional advantage, however; it reduces the temperature at which crystallization occurs.

Silicon is the semiconductor material most commonly used in electronic devices. Germanium, an alternative semiconductor material, has many desirable electrical properties, but has proven troublesome in fabrication and has not been as widely used. Silicon and germanium are fully miscible and alloys of silicon and germanium in general have properties intermediate between those of the two materials. Deposition and crystallization temperatures are lower for germanium than for silicon, and adding germanium to silicon in a silicon-germanium alloy lowers the deposition and crystallization temperatures of the alloy.

Polycrystalline silicon (which will be referred to in this discussion as polysilicon) is used in many semiconductor devices, for example in control gates and floating gates. Using conventional method, the temperatures required to deposit and crystallize the silicon used in these devices is relatively high, about 550 and 700 degrees C. or more, respectively. Aluminum is a low-resistivity metal, and aluminum and its alloys are widely used to form interconnects to semiconductor devices. Aluminum has a relatively low temperature tolerance, however, and sustained exposure to temperature of about 480 or about 490 degrees C. or above will cause aluminum metallization to soften and extrude, or even melt. Low-temperature aluminum metallization interconnects to high-temperature polysilicon can be formed by placing the aluminum structures above the polysilicon elements, after crystallization is complete, so that the aluminum need not be exposed to polysilicon crystallization temperatures.

Monolithic three dimensional memory arrays are described in Johnson et al., U.S. Pat. No. 6,034,882, "Vertically stacked field programmable nonvolatile memory and method of fabrication"; in Lee et al., U.S. Pat. No. 6,881,994, "Monolithic Three Dimensional Array of Charge Storage Devices Containing a Planarized Surface"; in Knall et al., U.S. Pat. No. 6,420,215, "Three Dimensional Memory Array and Method of Fabrication"; and in Herner et al., U.S. Pat. No. 6,952,030, "High-Density Three-Dimensional Memory Cell," hereinafter the '030 patent.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Because all of the memory levels in a monolithic three dimensional memory array are monolithically fabricated, each atop the previous one, above a single substrate, each memory level must be able to withstand the thermal conditions required to form all of the memory levels formed above it, and therefore after it. In general, in preferred embodiments of the Johnson et al., Lee et al., Knall et al., and Herner et al. memories described above, at least a portion of each memory cell, in each memory level, includes polysilicon. Because polysilicon is formed on every memory level, in most embodiments aluminum interconnects cannot be used within the memory array. In general within these arrays interconnects are formed of conductive silicides, such as titanium silicide, or metals, such as tungsten, which can tolerate higher temperature.

Figure 1:
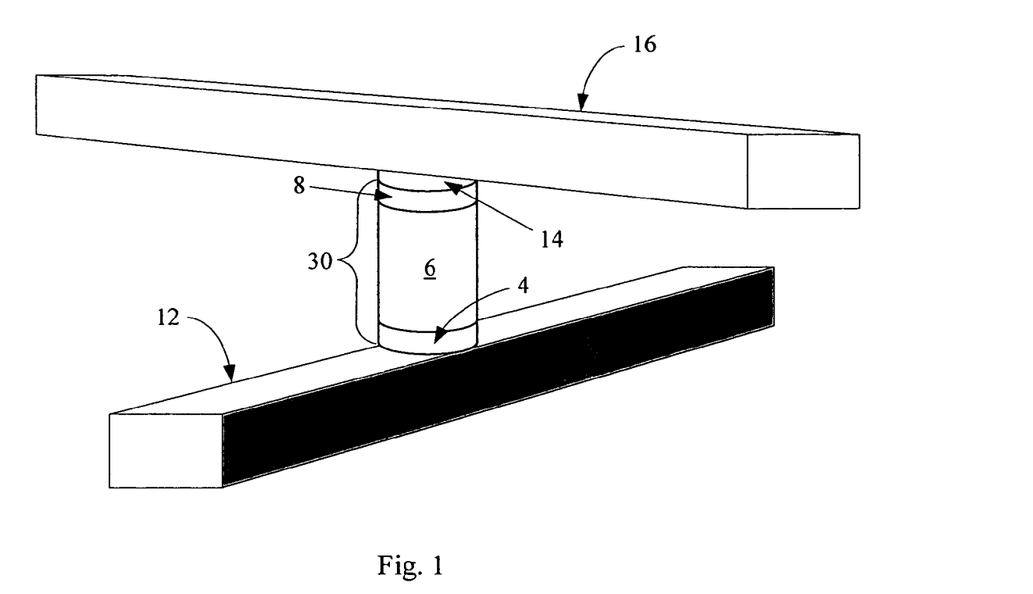
FIG. 1 is a perspective view of a memory cell including a semiconductor diode and an antifuse between conductors. The diode of this memory cell may be crystallized according to embodiments of the present invention.

For example, the '030 patent describes a monolithic three dimensional memory array comprising memory cells like that shown in FIG. 1. A vertically oriented polycrystalline semiconductor diode 30 having a heavily doped n-type region 4, an intrinsic region 6, and a top heavily doped p-type region 8 is disposed between bottom conductor 12 and top conductor 16, along with dielectric rupture antifuse 14.

Figure 2:
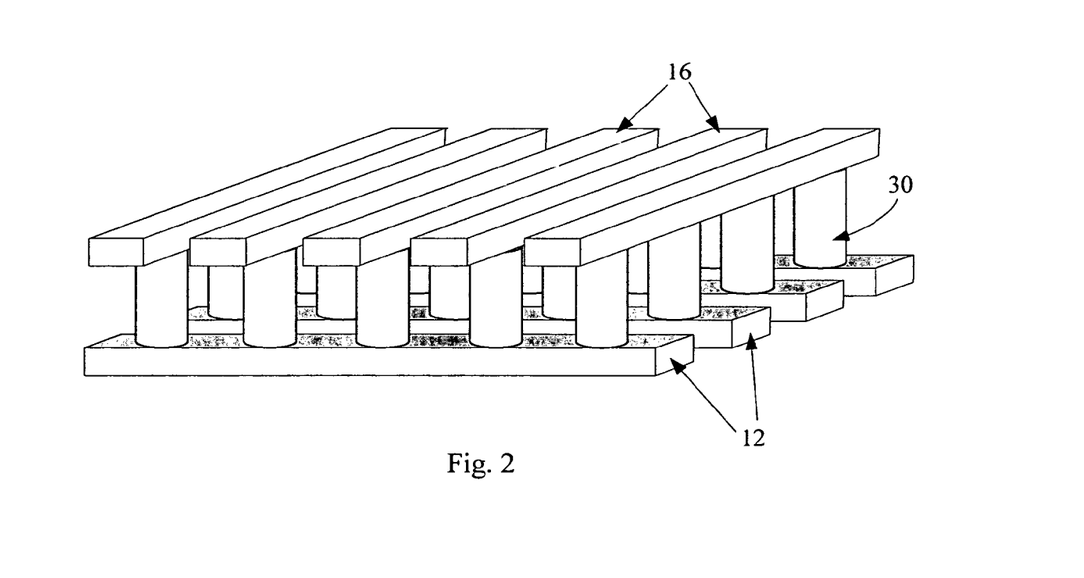
FIG. 2 is a perspective view of a memory level of the memory cells shown in FIG. 1.

FIG. 2 shows a memory level formed of memory cells like the memory cell shown in FIG. 1. Several such memory levels can be formed stacked atop one another, forming a monolithic three dimensional memory array.

Referring to FIG. 2, if diodes 30 are formed of polysilicon which is deposited and crystallized using conventional methods, and if additional memory levels which include polysilicon diodes are formed above this memory level, neither bottom conductors 12 nor top conductors 16 can be formed of low-temperature metals such as aluminum.

As noted, metal-induced crystallization serves to reduce the temperature required to crystallize an amorphous silicon film, and introduction of germanium lowers both deposition and crystallization temperatures of the resulting alloy further. In the present invention, metal-induced crystallization is used to crystallize a silicon-germanium alloy film at reduced temperature. In preferred embodiments of the present invention, the reduced processing temperature for polysilicon devices allows aluminum conductors to be used within memory levels of a monolithic three dimensional memory array formed of stacked memory levels.

Aspects of the present invention provide for depositing a film of a silicon-germanium alloy at a temperature below about 490 degrees C.; depositing a layer of a metal catalyst selected from the group consisting of nickel, cobalt, ruthenium, and aluminum, the metal catalyst in contact with the silicon-germanium film; and crystallizing the silicon-germanium alloy film at a temperature below about 490 degrees C., or preferably about 480 degrees C.

Referring to FIG. 1, the '030 patent described a one-time programmable memory cell pairing diode 30 with dielectric rupture antifuse 14, the two arranged electrically in series. When the memory cell is in its intact state, when a read voltage is applied between top conductor 16 and bottom conductor 12, very little current flows between them. After a programming voltage has been applied across the cell, and the dielectric rupture antifuse suffers dielectric breakdown, and a conductive path is permanently formed through it. After rupture of the antifuse, current flow under an applied read voltage is significantly higher. The difference in current flow under applied read voltage allows a programmed memory cell to be distinguished from an unprogrammed memory cell.

Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application; and Herner et al., U.S. patent application Ser. No. 11/148,530, "Nonvolatile Memory Cell Operating by Increasing Order in Polycrystalline Semiconductor Material," filed Jun. 8, 2005 and hereinafter the '530 application, both hereby incorporated by reference, both describe a monolithic three dimensional memory array of cells similar to the memory cell of FIG. 1, with dielectric rupture antifuse 14 omitted. It was found that when the polysilicon of diode 30 is crystallized adjacent to materials with which it has a high degree of lattice mismatch, the polysilicon has a high concentration of defects and has a high resistivity. In its initial unprogrammed state, even with no antifuse, very little current flows at read voltage due to the highly disordered crystalline structure of the polysilicon making up the diode. Application of a programming voltage serves to reduce the resistivity of the polysilicon of the diode, apparently by increasing the degree of crystalline order of the polysilicon. After programming, a much higher current flows when a read voltage is applied.

Figure 3:
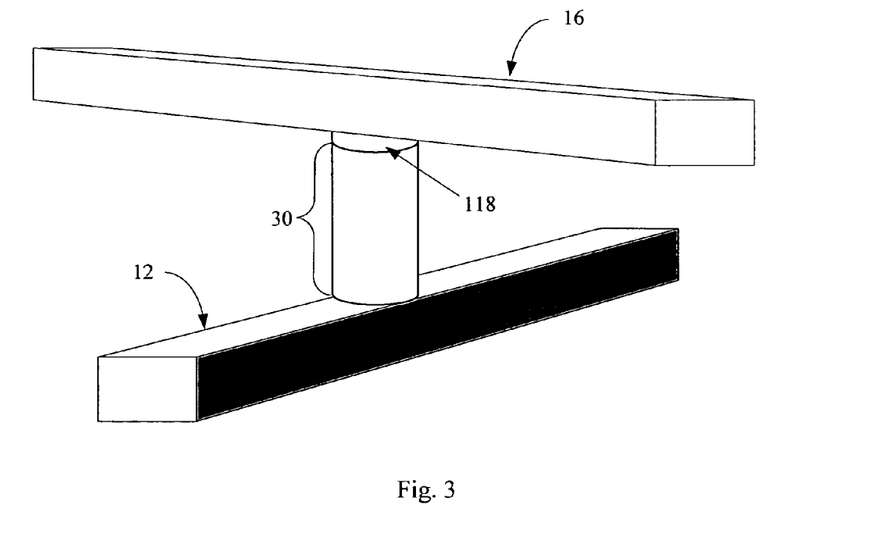
FIG. 3 is a perspective view of a memory cell pairing a diode and a resistivity-switching element.

Herner et al, U.S. patent application Ser. No. 11/395,995, "Nonvolatile Memory Cell Comprising a Diode and a Resistance-Switching Material," (attorney docket no. MA-146-1, which is a continuation-in-part of Herner et al., U.S. patent application Ser. No. 11/125,939), hereby incorporated by reference, describes the memory cell shown in FIG. 3, in which a semiconductor diode 30 is paired with a resistance-switching element, for example a layer 118 of a resistivity-switching metal oxide or nitride compound, the metal oxide or nitride compound including exactly one metal. The diode and the resistance-switching element are arranged electrically in series between top and bottom conductors. Preferred resistivity-switching metal oxides or nitrides include $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, where x and y range between 0 and 1. Examples are the stoichiometric compounds NiO, $Nb_2O_5$, $TiO_2$, $HfO_2$, $Al_2O_3$, $MgO_x$, CoO, $CrO_2$, VO, ZnO, ZrO, BN, and AlN, but nonstoichiometric compounds may be used as well. The resistivity-switching metal oxide or nitride compound is formed in either a high-resistivity or low-resistivity state, and can reversibly be switched between two or more stable resistivity states. The resistivity state of the metal oxide or nitride determines how much current flows through the memory cell under an applied read voltage; as in the prior memory cells, the current flow distinguishes the data state of the memory cell.

The methods of the present invention can be used to form monolithic three dimensional memory arrays. Embodiments will be described in which metal-induced crystallization is used to crystallize a diode formed of a silicon-germanium alloy, forming a) a diode paired with a resistivity-switching metal oxide or nitride, as in the '939 application; and b) a one-time programmable cell with a diode and antifuse, as in the '030 patent, or with no antifuse, as in the '549 and '530 applications. Use of the methods of the present invention allows aluminum or aluminum alloys to be used in conductors throughout the stacked memory levels of these memory arrays. The use of low-resistance aluminum conductors (compared to tungsten conductors, for example) improves array performance, increasing write bandwidth.

Diode and Resistivity-Switching Material Memory Cell

A detailed example will be provided of fabrication of a first memory level of a monolithic three dimensional memory array. In this example, in each memory cell a diode is paired with a layer of a resistivity-switching metal oxide or nitride compound, as in the '939 application. Many fabrication details and options are presented in the '939 application and the other applications. To avoid obscuring the invention, not all of those details will be included in this example. It will be understood, however, that no teaching of the '939 application, or the other incorporated patents and applications, is intended to be excluded.

For completeness, many details of fabrication, including materials, temperatures, etc., are provided. It will be understood that this example, like those that follow, is not intended to be limiting, and many materials and steps can be modified, deleted, or augmented while the results fall within the scope of the invention.

Figure 4A:
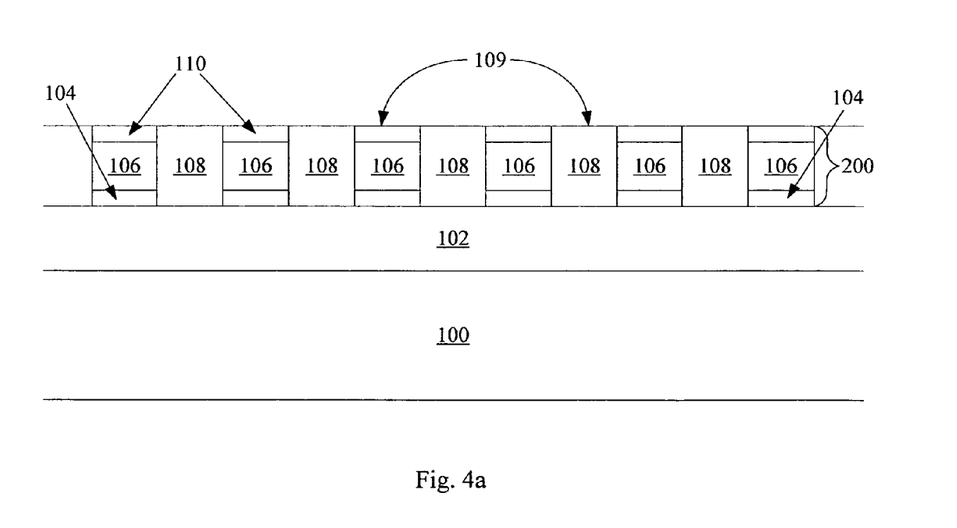
FIGS. 4a-4d are cross-sectional views of stages of fabrication of a first memory level of a monolithic three dimensional memory array formed according to an embodiment of the present invention.

Turning to FIG. 4a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. The first layer deposited may be adhesion layer 104; preferred materials for adhesion layer 104 are titanium or titanium nitride, though other materials may be used, or this layer may be omitted. Adhesion layer 104 can be deposited by any conventional method.

The thickness of adhesion layer 104 can range from about 20 to about 500 angstroms, and is preferably between about 50 and about 400 angstroms, most preferably about 100 angstroms. Note that in this discussion, "thickness" will denote vertical thickness, measured in a direction perpendicular to substrate 100.

The next layer to be deposited is conducting layer 106. Conducting layer 106 is preferably an aluminum alloy, for example aluminum with 1% Si and 0.5% Cu, though conducting layer 106 can comprise any conducting material known in the art, such as doped semiconductor metals such as tungsten or conductive metal silicides. The thickness of conducting layer 106 can depend, in part, on the desired sheet resistance and therefore can be any thickness that provides the desired sheet resistance. In one embodiment, the thickness of conducting layer 106 can range from about 500 to about 5000 angstroms, preferably about 1000 to about 2000 angstroms, most preferably about 1400 angstroms.

Barrier layer 110, preferably of titanium nitride or titanium tungsten, is deposited on conducting layer 106. A photolithography step will be performed to pattern aluminum layer 106 and adhesion layer 104. The high reflectivity of aluminum makes it difficult to successfully perform photolithography directly on an aluminum layer. Barrier layer 110 serves as an anti-reflective coating, and, as will be described, may serve as a planarization stop during an upcoming planarization step. Barrier layer 110 may be between about 200 and about 600 angstroms thick, preferably about 500 angstroms thick.

Once all the layers that will form the bottom conductors have been deposited, the layers will be patterned and etched using any suitable masking and etching process to form substantially parallel, substantially coplanar rail-shaped conductors 200, shown in FIG. 4a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 4a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883,417, "Nonselective Unpatterned Etchback to Expose Buried Patterned Features," filed Jun. 30, 2004 hereinafter the '417 application and hereby incorporated by reference in its entirety, can advantageously be used. Either planarization method, CMP or etchback, will remove some thickness of barrier layer 110. Preferably at least about 100 angstroms of barrier layer 110 remains at planarized surface 109.

Figure 4B:
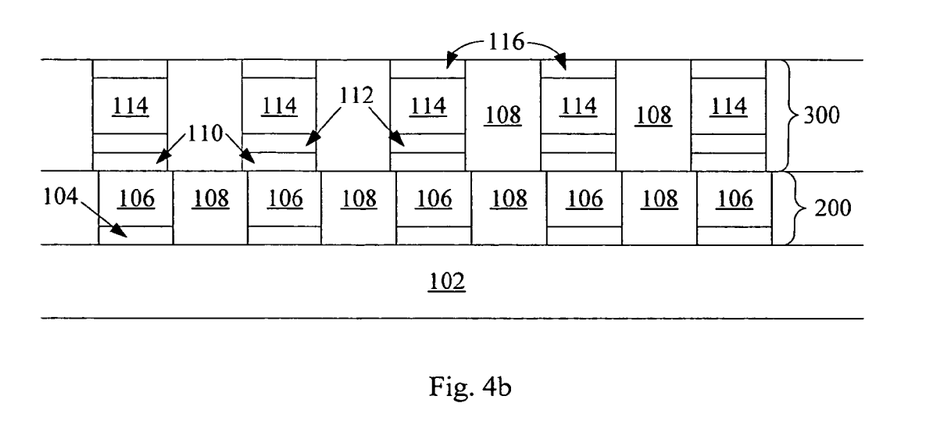

Next, turning to FIG. 4b, diodes will be formed above completed conductor rails 200. (To save space substrate 100 is omitted in FIG. 4b and subsequent figures; its presence will be assumed.) Semiconductor material that will be patterned into pillars is deposited. A silicon-germanium alloy film will be deposited. The silicon-germanium alloy preferably is between about 5 and about 50 atomic percent germanium, more preferably between about 10 and about 30 atomic percent germanium, or between about 15 and about 25 atomic percent germanium, for example about 20 atomic percent germanium.

In preferred embodiments, the semiconductor pillar comprises a junction diode. The term junction diode is used herein to refer to a semiconductor device with the property of non-ohmic conduction, having two terminal electrodes, and made of semiconducting material which is p-type at one electrode and n-type at the other. A preferred junction diode is a p-i-n diode, comprising a bottom heavily doped region of a first conductivity type and a top heavily doped region of a second conductivity type. The middle region, between the top and bottom regions, is an intrinsic or lightly doped region of either the first or second conductivity type.

In this example, bottom heavily doped region 112 is a heavily doped n-type silicon-germanium alloy. In a most preferred embodiment, heavily doped region 112 is deposited and doped with an n-type dopant such as phosphorus by any conventional method, preferably by in situ doping. This layer is preferably between about 100 and about 800 angstroms, most preferably about 200 angstroms.

Next a region 114 is of silicon-germanium which is intrinsic, or not intentionally doped, is deposited. Between about 800 and about 5000 angstroms of intrinsic silicon-germanium is deposited by any conventional method; preferably between about 1000 and about 4300 angstroms; most preferably about 3500 angstroms. If desired, silicon-germanium region 114 can be lightly doped.

Regions 114 and 112 are patterned and etched into pillars 300. Pillars 300 should have about the same pitch and about the same width as conductors 200 below, such that each pillar 300 is formed on top of a conductor 200. Some misalignment can be tolerated.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

A dielectric material 108, for example an HDP oxide such as silicon dioxide, is deposited over and between pillars 300, filling gaps between them. Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used. Finally top heavily doped region 116 is formed by ion implantation of a p-type dopant such as boron or $BF_2$. Heavily doped region 116 is preferably less than about 200 angstroms thick. In this example, the diodes have a bottom n-doped region and a top p-doped region. In an alternative embodiment, the polarity of the diodes could be reversed. FIG. 4b shows the structure at this point.

Figure 4C:
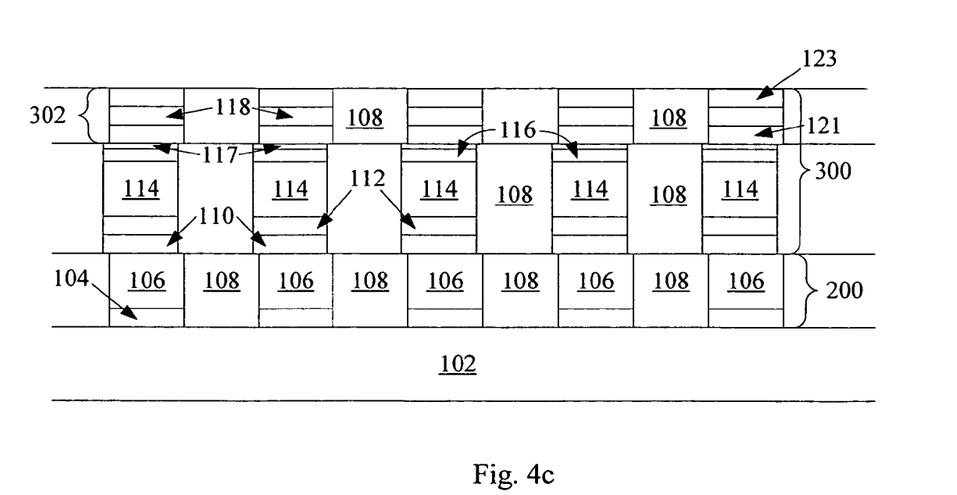

Turning to FIG. 4c, a very thin layer (not shown) of a metal catalyst known to enhance crystallization of silicon or silicon-germanium alloys is deposited on the planarized surface. The metal catalyst is preferably selected from the group consisting of nickel, cobalt, ruthenium, and aluminum. For simplicity, this discussion will describe the use of nickel as a metal catalyst, but it will be understood that the other named materials can be used instead. The nickel layer is as thin as possible, for example about 20 angstroms thick, but should preferably be continuous, or nearly so. Preferably a capping layer (not shown) of about 100 angstroms of, for example, titanium nitride or titanium is deposited on the nickel layer.

A low-temperature anneal step is performed to react the nickel with the silicon-germanium alloy. Where the nickel contacts regions 116 at the top of each pillar 300, a very thin layer 117 of a nickel silicide-germanide, $NiSi_xGe_y$, is formed, but does no substantially crystallize the SiGe film. This anneal can be a rapid thermal anneal performed at between about 350-400 degrees C. for about 30 seconds. After the anneal, a selective wet etch removes the titanium or titanium nitride capping layer and the unreacted nickel, leaving behind disks 117 of $NiSi_xGe_y$. Layer 117 of $NiSi_xGe_y$ is thinner than it appears in FIG. 4c. If this layer were shown in proportion to other layers, it would not be visible.

Next a conductive barrier layer 121, for example of titanium nitride, is deposited on $NiSi_xGe_y$ layer 117. Barrier layer 121 may be between about 50 and about 400 angstroms, preferably between about 100 and about 200 angstroms. In some embodiments, layer 121 may be omitted.

A layer 118 of a metal oxide or nitride resistivity-switching material is deposited on barrier layer 121. This layer is preferably between about 50 and about 400 angstroms, for example between about 100 and about 200 angstroms. Layer 118 can be any of the materials described earlier, and is preferably formed of a metal oxide or nitride compound including exactly one metal which exhibits resistivity-switching behavior; preferably a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$ and $Al_xN_y$.

For simplicity this discussion will describe the use of nickel oxide in layer 118. It will be understood, however, that any of the other materials described can be used. It will further be understood that in this discussion "nickel oxide" refers to both stoichiometric and nonstoichiometric oxides of nickel.

As described in Herner et al., U.S. patent application Ser. No. 11/287,452, "Reversible Resistivity-Switching Metal Oxide or Nitride Layer with added Metal," filed Nov. 23, 2005, hereby incorporated by reference, adding a metal to the binary metal oxide or nitride compound can decrease the voltages required to induce the material to switch between high- and low-resistivity states. In general, the metal additive is between about 0.01 and about 5 percent of the metal atoms in the layer of metal oxide or nitride compound. Preferred metals to use for the metal additive are selected from the group consisting of cobalt, aluminum, gallium, indium, manganese, nickel, niobium, zirconium, zinc, titanium, hafnium, tantalum, magnesium, chromium, vanadium, boron, yttrium, and lanthanum. In preferred embodiments, nickel oxide layer 118 includes an added metal. Finally optional barrier layer 123, for example of titanium nitride, is deposited on nickel oxide layer 118. Layer 123 may be between about 200 and about 1000 angstroms thick. Barrier layer 123, nickel oxide layer 118, and barrier layer 121 are patterned and etched to form short pillars 302, ideally directly on top of pillars 300 formed in the previous pattern and etch step. Some misalignment may occur, as shown in FIG. 4c, and can be tolerated. Layer 118 of nickel oxide can be sputter etched, or is preferably etched using a chemical process as described in Raghuram et al., U.S. patent application Ser. No. 11/179,423, "Method of Plasma Etching Transition Metals and Their Compounds," filed Jun. 11, 2005, hereinafter the '423 application and hereby incorporated by reference.

Gaps between short pillars 302 are filled with dielectric material 108, then another planarization step, for example by CMP or etchback, removes dielectric overfill and exposes tops of pillars 300, which now include short pillars 302, as shown in FIG. 4c.

Figure 4D:
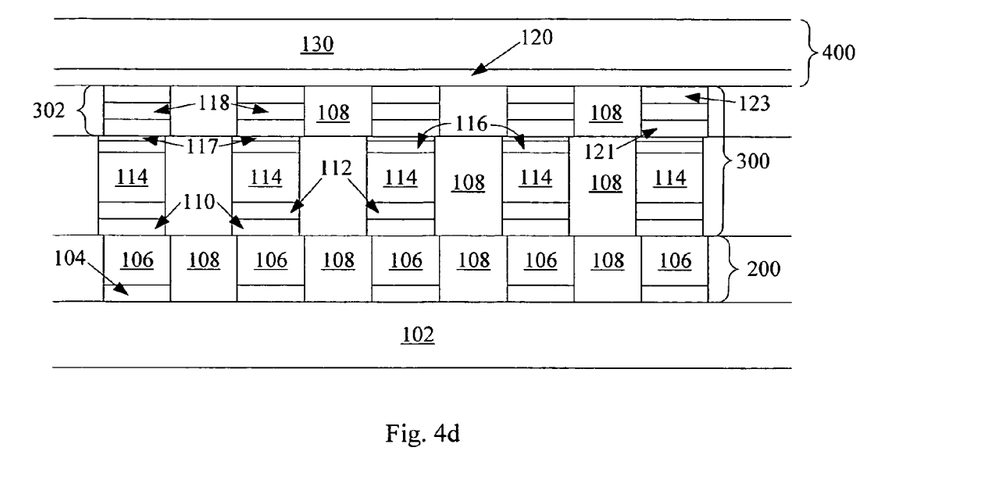

Turning to FIG. 4d, next a conductive material or stack is deposited to form the top conductors 400. In a preferred embodiment, titanium nitride barrier layer 120 is deposited next, followed by layer 130 of aluminum or an aluminum alloy. An optional top conductive layer (not shown) may be included to serve as an antireflective coating during photolithography. Top conductors 400 can be patterned and etched in the same manner as bottom conductors 200.

What has been formed is a first story or memory level of memory cells. Additional memory levels can be formed above this first memory level. In some embodiments, conductors can be shared between memory levels; i.e. top conductor 400 would serve as the bottom conductor of the next memory level. In other embodiments, an interlevel dielectric is formed above the first memory level of FIG. 4d, its surface planarized, and construction of a second memory level begins on this planarized interlevel dielectric, with no shared conductors. If conductors are to be shared between memory levels, a planarization step will be performed (as with bottom conductors 200) to expose conductors 400. This planarization step will remove some thickness of top conductors 400, so in this case a top conductive layer is preferably deposited with sufficient thickness to tolerate this loss; tungsten or titanium tungsten are preferred.

The silicon-geramanium of the diodes in this memory level must be crystallized, preferably by exposure to a temperature less than about 490 degrees C., most preferably at about 480 degrees C. or less, for example about 475 degree C. or less. This crystallization may be done in a separate anneal step. Higher germanium content of the silicon-germanium alloy will allow for lower crystallization temperature, a shorter crystallizing anneal, or both. In a preferred embodiment, the silicon-germanium alloy is about 20 atomic percent germanium, and the array is annealed at about 480 degrees C. for between about one and about four hours.

In preferred embodiments, deposition of silicon-germanium diodes in the second memory level will take place in this preferred temperature range, for sufficient time (one to ten hours) to crystallize the silicon-germanium diodes of the first memory level, and no separate anneal is required. Similarly, deposition of silicon-germanium in a third memory level serves as the crystallizing anneal for diodes in a second memory level, and so forth. A final anneal should be performed to crystallize the silicon-germanium diodes of the final memory level.

During the crystallizing anneal, the $NiSi_xGe_y$ film 119 formed earlier advances through the diode, leaving high-quality crystallized silicon-germanium behind it. When crystallization is finished, a thin film of $NiSi_xGe_y$ remains at the top and/or the bottom of the diode.

In this monolithic three dimensional memory array, the low-temperature methods of the present invention have allowed a silicon-germanium film to be deposited and crystallized above aluminum metallization, the aluminum metallization disposed between the silicon-germanium film and a monocrystalline semiconductor substrate.

Many variations are possible, and cannot all be detailed; only a few will be mentioned. In this example, unreacted nickel remaining after the anneal to form $NiSi_xGe_y$ was removed by a wet etch to avoid or limit nickel contamination of the diode. If the nickel layer is sufficiently thin, however, and if solubility of nickel is higher in the adjacent contacts than in silicon-germanium (causing the nickel to tend to preferentially migrate to the conductors), removal of nickel may prove unnecessary. The method of the '423 application can be used to etch the remaining nickel.

In an alternative embodiment, nickel can be deposited electrochemically.

In the present example a low-temperature anneal was performed for each memory level to form $NiSi_xGe_y$, then crystallization took place during deposition of silicon-germanium in the next memory level, and a final anneal completed crystallization of the final memory level. In alternative embodiments, a crystallizing anneal may be performed for each memory level, before the next memory level is formed.

In one alternative, as described in the '939 application, the diode can be patterned and etched and gaps between them filled, then nickel oxide layer 118 and its associated barrier layers deposited, then patterned and etched in a separate step. The nickel oxide layer 118 can be formed elsewhere in the memory cell: in the top conductors, for example, or below the diode.

In the example provided, the silicon-germanium alloy film was about 20 atomic percent germanium. Germanium and silicon can be combined in any proportion. Several advantages come with increased germanium content, including a decrease in deposition and crystallization temperature and higher current in the resulting diode.

In addition, adding germanium to silicon may allow for a larger intrinsic region. In situ doping is achieved by flowing a donor gas that will provide dopant atoms, such as phosphorus or arsenic, during deposition of the silicon-germanium alloy. When the desired doped thickness has been deposited, the flow of the donor gas is stopped while silicon-germanium deposition continues. During deposition of pure silicon, phosphorus or arsenic atoms exhibit surfactant behavior, tending to migrate upward toward the surface as silicon deposition continues; thus some thickness of silicon contain phosphorus or arsenic even after flow of the donor gas providing phosphorus or arsenic has been stopped. The heavily doped region will be thicker, and the intrinsic region thinner, than desired.

It has been found that inclusion of germanium with silicon during in situ doping of a deposited layer suppresses the surfactant behavior of n-type dopants such as phosphorus. Increased germanium content, then, allows for a sharper transition between the heavily doped n-type region and the intrinsic region.

There are disadvantages with increased germanium content, however. A diode preferably acts as a one-way valve, readily allowing current flow (above a turn-on voltage) in one direction, the diode's forward direction, when the diode is under forward bias, and allowing minimal current flow in the reverse direction under reverse bias. Germanium has a smaller band gap than silicon, and as germanium content increases, current flow through the diode under reverse bias increases. This leakage current increasing overall power use of the device.

Thus the advantages and disadvantages of increased germanium content must be balanced. In the embodiment just described, between about 15 and about 25 atomic percent germanium, for example about 20 atomic percent germanium, has proven to be an advantageous proportion, though more or less germanium may be used.

One-Time-Programmable Diode Memory Cell

A detailed example will be provided of a method to fabricate a monolithic three dimensional memory array comprising one-time programmable memory cells, the cells including silicon-germanium alloy diodes. The silicon-germanium will be crystallized according to a preferred embodiment of the present invention.

Figure 5A:
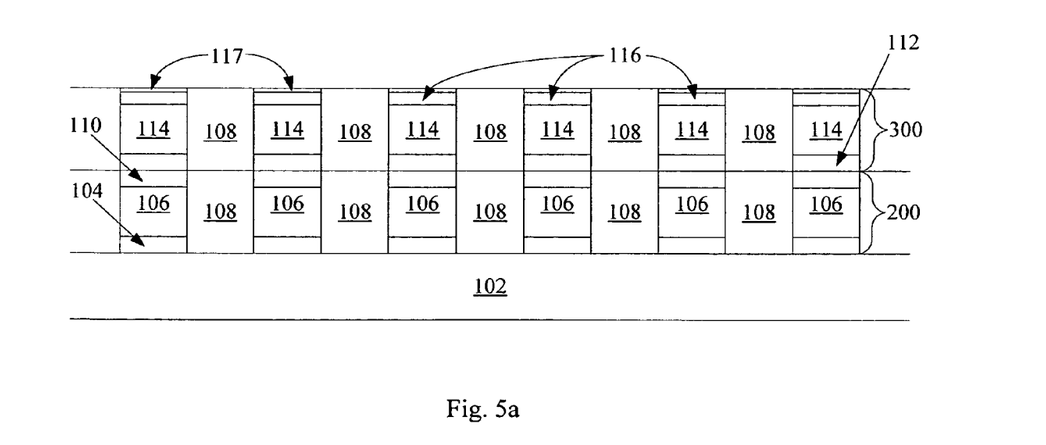
FIGS. 5a and 5b are cross-sectional views of stages of fabrication of a first memory level of a monolithic three dimensional memory array formed according to another embodiment of the present invention.

Turning to FIG. 5a, bottom conductors 200 are formed as in the prior embodiment. Conductive layer 106 is preferably aluminum or an aluminum alloy.

Preferably about 200 angstroms of heavily doped n-type silicon-germanium is deposited as in the prior embodiment to form region 112. Next a thickness of intrinsic silicon-germanium is deposited. This thickness will undergo a planarization step that will reduce its thickness, then will be implanted to form a top heavily doped p-type region 116. The final desired intrinsic thickness of intrinsic region 114, as in the prior embodiment, is preferably between about 1000 and about 5000 angstroms; more preferably between about 1600 and about 4300 angstroms, most preferably about 3300 angstroms. The thickness of intrinsic silicon-germanium deposited in this step should be the sum of the final desired thickness of intrinsic region 114 (e.g. 1000 to 3500 angstroms), plus the anticipated thickness of heavily doped region 116 after implant (e.g. 200 angstroms), plus a sacrificial amount to be lost during planarization (e.g. 800 angstroms). For example, between about 1000 and about 5000 angstroms of silicon-germanium alloy may be deposited.

Silicon-germanium regions 114 and 112 are patterned and etched to form pillars 300. Dielectric material 108 is deposited over and between pillars 300, and a planarization step, for example by CMP, removes overfill of dielectric 108 and exposes tops of pillars 300 at a substantially planar surface.

Next a thin nickel layer (not shown), with a thin capping layer of titanium or titanium nitride (also not shown) is deposited on this planar surface. Top heavily doped p-type regions 116 are formed by ion implantation of a p-type dopant such as boron or BF$_2$. A low-temperature anneal is performed to form NiSi$_x$Ge$_y$ layer 117, as in the prior embodiment. Note that NiSi$_x$Ge$_y$ 117 is formed only where nickel contacts silicon-germanium regions 116 at tops of pillars 300, and consumes some portion of the silicon-germanium. Between tops of pillars 300, where nickel contacts dielectric 108, no NiSi$_x$Ge$_y$ 117 is formed. A wet etch removes the titanium or titanium nitride capping layer and unreacted nickel. FIG. 5a shows the structure at this point.

The one-time programmable memory cell may include a dielectric rupture antifuse, as in the '030 patent, or this antifuse may be omitted, as described in the '549 and '530 applications.

Figure 5B:
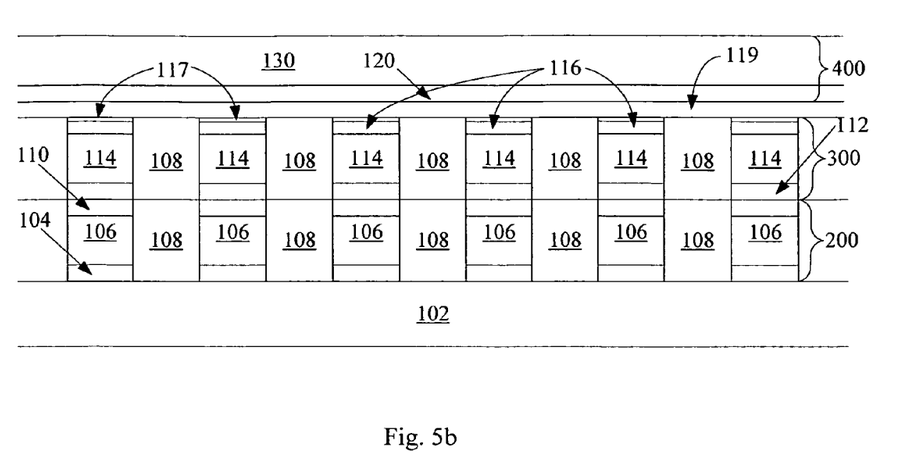

Turning to FIG. 5b, if a dielectric rupture antifuse 119 is to be included, it is deposited at this point. In a preferred embodiment, Al$_2$O$_3$ is deposited by atomic layer deposition (ALD) at 350 degrees C. using tetramethyl ammonium hydroxide and H$_2$O, to a thickness preferably between about 10 and about 100 angstroms, most preferably about 30 angstroms. Alternatively, HfO$_2$ can be deposited at relatively low temperature by ALD, preferably to a thickness between about 10 and about 200 angstroms, most preferably about 80 angstroms.

If, after crystallization, the crystallized silicon-germanium has a very low level of defects, a dielectric rupture antifuse is used, and an unprogrammed memory cell is distinguished from a programmed memory cell by the state of the antifuse, intact or ruptured. If the crystallized silicon-germanium diode has a higher level of defects, however, the device may operate without dielectric rupture antifuse 119, as in the '549 and '530 applications.

Top conductors 400 are formed as in the prior application, completing the first memory level, shown in FIG. 5b. As in the prior embodiment, additional memory levels can be monolithically formed above this one, and conductors may or may not be shared between memory levels. A single crystallizing anneal performed after all of the memory levels have been formed crystallizes the silicon-germanium diodes on all memory levels.

Lee et al., mentioned earlier; Scheuerlein et al., U.S. patent application Ser. No. 10/335,078, "Programmable Memory array Structure Incorporating Series-Connected Transistor Strings and Methods for Fabrication and Operation of Same," filed Dec. 31, 2002; and Herner, U.S. patent application Ser. No. 11/077,901, "Bottom-Gate SONOS-Type Cell Having a Silicide Gate," filed Mar. 11, 2005, all hereby incorporated by reference, describe monolithic three dimensional memory arrays. In these arrays, the stacked memory levels include memory cells which operate by charge storage. For example, the memory cells are thin film transistor floating gate or SONOS-type memory cells having polysilicon channel regions. The amount of charge stored in either a polysilicon floating gate (in floating gate memory cells) or a dielectric layer (typically silicon nitride, in a SONOS-type memory cell) affects the threshold voltage of the transistor. The difference in threshold voltage allows one data state to be distinguishable from another.

The methods of the present invention can be used in the charge storage memory arrays described by Lee et al., Scheuerlein et al., and Herner. The deposited silicon films are replaced with deposited silicon-germanium alloy films, and deposition and crystallization temperature of the silicon-germanium alloy films are reduced below about 490 degrees C., preferably about 480 degrees C. or below, with the use of one of the named metal catalysts. In preferred embodiments, the memory cells include field effect transistor, wherein a channel region of the field effect transistor comprises a portion of the silicon-germanium alloy film. The silicide or high-temperature metal conductors in these memories can be replaced with lower-temperature aluminum.

Herner, U.S. patent application Ser. No. 10/954,510, "Memory Cell Comprising a Semiconductor Junction Diode Crystallized Adjacent to a Silicide," filed Sep. 29, 2004 and hereby incorporated by reference, describes a diode crystallized adjacent to a silicide, for example titanium silicide, in which the silicide provides a crystallization template during the crystallization of silicon, resulting in higher quality crystalline silicon with fewer defects. This crystallization technique, in which a silicide like titanium silicide provides a crystallization template, is akin to the metal-induced crystallization used in the present invention, but is not the same.

The mechanisms differ in at least two important ways. When a metal catalyst such as nickel, cobalt, ruthenium or aluminum aids crystallization of silicon or silicon-germanium, the metal catalyst combines with the silicon or silicon-germanium, and a crystallization front comprising atoms of the metal catalyst, for example in a metal silicide-germanide, advances through the silicon or silicon-germanium film, leaving high-quality crystallized silicon or silicon-germanium behind it.

In contrast, when silicon crystallizes in contact with titanium silicide, the titanium silicide provides a template so that, during crystallization, silicon atoms tend to fall into a low-defect lattice structure. The titanium, or titanium silicide, does not migrate through the silicon during crystallization.

Additionally, an important advantage of the methods of the present invention is that crystallization using one of the named metal catalysts can be performed at reduced temperature. Reduced temperature, as described, affords many advantages, including reducing unwanted dopant diffusion and allowing the use of aluminum metallization in a monolithic three-dimensional stacked structure of memory levels. Crystallization adjacent to a silicide like titanium silicide, which does not advance through the silicon or silicon-germanium, does not reduce crystallization temperature.

Those skilled in the art might expect that as a crystallization front including atoms of a metal catalyst advances through doped silicon or silicon-germanium, crossing dopant profiles (such as the transition between heavily doped region 116 and intrinsic region 114 of FIG. 4d, for example), the front will tend to bring dopant atoms with it, encouraging unwanted dopant diffusion. It has been found, however, that, using methods according to the present invention, very little such dopant diffusion occurs, and dopant transitions remain sharp.

Thus the methods of the present invention can be used to crystallize a silicon-germanium film wherein, before crystallization, the silicon-germanium film comprises an n-doped first region and a p-doped second region, the first region and second region not overlapping, and wherein the first region and the second region are crystallized. As in the vertically oriented diode described, the n-doped first region may be above or below the p-doped first region.

Detailed methods of fabrication have been described herein, but it will be understood that other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for crystallizing a semiconductor film, the method comprising:
   depositing a film of a silicon-germanium alloy at a temperature below about 490 degrees C.;
   depositing a layer of a metal catalyst selected from the group consisting of nickel, cobalt, ruthenium, and aluminum, the metal catalyst in contact with the silicon-germanium film; and
   crystallizing the silicon-germanium alloy film at a temperature below about 490 degrees C.

2. The method of claim 1 wherein the silicon-germanium alloy is between about 5 and about 50 atomic percent germanium.

3. The method of claim 2 wherein the silicon-germanium alloy is between about 10 and about 30 atomic percent germanium.

4. The method of claim 1 wherein the metal is nickel.

5. The method of claim 1 wherein, during the crystallizing step, the temperature is about 480 degrees C. or below.

6. The method of claim 1
   wherein, before the crystallizing step, the silicon-germanium film comprises an n-doped or p-doped first region, and
   wherein the n-doped or p-doped first region is crystallized during the crystallizing step.

7. The method of claim 6
   wherein, before the crystallizing step, the silicon-germanium film comprises an n-doped first region and a p-doped second region, the first region and second region not overlapping, and
   wherein the first region and the second region are crystallized during the crystallizing step.

8. The method of claim 7 wherein the n-doped first region is above or below the p-doped second region.

9. The method of claim 1 further comprising, after the step of depositing the metal catalyst and before the crystallizing step, annealing to react the metal catalyst with the silicon-germanium alloy to form a silicide-germanide.

10. The method of claim 1 further comprising patterning and etching the silicon-germanium film to form a plurality of pillars.

11. The method of claim 10 wherein the each pillar comprises a vertically oriented semiconductor junction diode.

12. The method of claim 1 wherein the silicon-germanium film is deposited above a monocrystalline semiconductor substrate and above aluminum metallization, the aluminum metallization disposed between the silicon-germanium film and the monocrystalline semiconductor.

13. The method of claim 1 wherein, during the crystallization step, a crystallization front comprising atoms of the metal catalyst advances through the silicon-germanium film.

14. A method for forming a first memory level comprising a plurality of first memory cells, the method comprising:
   depositing a film of a silicon-germanium alloy at a temperature below about 490 degrees C.;
   depositing a layer of a metal catalyst selected from the group consisting of nickel and aluminum, the metal catalyst in contact with the silicon-germanium film;
   crystallizing the silicon-germanium alloy film at a temperature not exceeding about 490 degrees C.; and
   forming the first memory cells, wherein each memory cell comprises a portion of the silicon-germanium alloy film.

15. The method of claim 14 wherein, during the crystallizing step, the temperature does not exceed about 480 degrees C.

16. The method of claim 14, wherein the silicon-germanium alloy is between about 5 and about 50 atomic percent germanium.

17. The method of claim 16 wherein the silicon-germanium alloy is between about 15 and about 25 percent germanium.

18. The method of claim 14 wherein the step of forming the first memory cells comprises patterning and etching the silicon-germanium alloy film to form first pillars.

19. The method of claim 18 wherein the each memory cell comprises one of the first pillars, and wherein each first pillar comprises a vertically oriented semiconductor junction diode.

20. The method of claim 19 wherein each memory cell further comprises a resistance-switching element arranged electrically in series with the diode.

21. The method of claim 20 wherein the resistance-switching element comprises a layer of a resistivity-switching metal oxide or nitride compound, the metal oxide or nitride compound including exactly one metal, the layer of the metal oxide or nitride compound arranged electrically in series with the diode.

22. The method of claim 21 wherein the metal oxide or nitride compound is selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $A_xIN_y$.

23. The method of claim 19 wherein each memory cell further comprises a dielectric rupture antifuse, the dielectric rupture antifuse arranged electrically in series with the diode.

24. The method of claim 14 wherein each memory cell comprises a field effect transistor, and wherein a channel region of the field effect transistor comprises a portion of the silicon-germanium alloy film.

25. The method of claim 14 wherein, during the crystallization step, a crystallization front comprising atoms of the metal catalyst advances through the silicon-germanium alloy film.

26. The method of claim 14 wherein the silicon-germanium alloy film is deposited above a semiconductor substrate.

27. The method of claim 26 further comprising, before the step of depositing the silicon-germanium alloy film, forming aluminum metallization above the semiconductor substrate.

28. A method for forming a monolithic three dimensional memory array, the method comprising:
  a) monolithically forming a first memory level above a substrate by a method comprising:
    i) depositing an amorphous film of a silicon-germanium alloy;
    ii) depositing a metal catalyst in contact with the silicon-germanium alloy film, the metal catalyst selected from the group consisting of nickel and aluminum;
    iii) annealing to crystallize the silicon-germanium alloy film, wherein during the steps of depositing and annealing the silicon-germanium alloy film, the temperature does not exceed about 490 degrees C.;
    iv) forming a first plurality of memory cells, each memory cell comprising a portion of the silicon-germanium alloy film, the first memory level comprising the first plurality of memory cells; and
  b) monolithically forming a second memory level above the first memory level.

29. The method of claim 28 wherein, during the steps of depositing and annealing the silicon-germanium alloy film, the temperature does not exceed about 480 degrees C.

30. The method of claim 28, wherein the silicon-germanium alloy is between about 10 and about 30 atomic percent germanium.

31. The method of claim 28 wherein the first memory level further comprises a first plurality of substantially parallel, substantially coplanar rail-shaped conductors comprising aluminum.

32. The method of claim 28 wherein the step of forming the first memory level further comprises patterning and etching the silicon-germanium alloy film to form first pillars.

33. The method of claim 32 wherein each first pillar comprises a vertically oriented diode, wherein each first memory cell comprises one of the first pillars.

34. The method of claim 33 wherein each first memory cell further comprises a resistance-switching element arranged in series with the diode.

35. The method of claim 34 wherein each resistance switching element comprises a layer of a resistivity-switching metal oxide or nitride compound, the metal oxide or nitride compound including exactly one metal, the layer of the metal oxide or nitride compound arranged electrically in series with the diode.

36. The method of claim 35 wherein the metal oxide or nitride compound is selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $A_xIN_y$.

37. The method of claim 33 wherein each memory cell further comprises a dielectric rupture antifuse, the dielectric rupture antifuse arranged electrically in series with the diode.

38. The method of claim 28 wherein each of the first memory cells comprises a field effect transistor, wherein a channel region of the field effect transistor comprises a portion of the silicon-germanium alloy film.

* * * * *

UNITED STATES PATENT AND TRADEMARK OFFICE
CERTIFICATE OF CORRECTION

PATENT NO.      : 7,501,331 B2                                           Page 1 of 1
APPLICATION NO. : 11/395420
DATED           : March 10, 2009
INVENTOR(S)     : S. Brad Herner It is certified that error appears in the above-identified patent and that said Letters Patent is hereby corrected as shown below:

Column 15, claim 22, line 25; please replace "$Mg_xO_yCo_xO_y$," with -- $Mg_xO_y$, $Co_xO_y$, --

Signed and Sealed this

Seventh Day of April, 2009

JOHN DOLL
*Acting Director of the United States Patent and Trademark Office*